United States Patent
Inoue et al.

(10) Patent No.: US 6,200,838 B1
(45) Date of Patent: Mar. 13, 2001

(54) COMPOUND SEMICONDUCTOR DEVICE AND METHOD OF MANUFACTURING THE SAME

(75) Inventors: Kazutaka Inoue; Hajime Matsuda, both of Yamanashi (JP)

(73) Assignee: Fujitsu Quantum Devices Limited, Yamanashi (JP)

(*) Notice: Subject to any disclaimer, the term of this patent is extended or adjusted under 35 U.S.C. 154(b) by 0 days.

(21) Appl. No.: 09/357,770

(22) Filed: Jul. 21, 1999

(30) Foreign Application Priority Data

Nov. 13, 1998 (JP) .................................. 10-323813

(51) Int. Cl.[7] .................................................. H01L 21/338
(52) U.S. Cl. ............................................ 438/175; 257/192
(58) Field of Search .................................. 257/192, 194, 257/195; 438/167, 185, 175, 285, 590

(56) References Cited

U.S. PATENT DOCUMENTS

| 5,324,969 | 6/1994 | Murai et al. |
| 5,672,890 | * 9/1997 | Nakajima ........................ 257/192 |

FOREIGN PATENT DOCUMENTS

| 58-56471 | 4/1983 | (JP) . |
| 58-123753 | 7/1983 | (JP) . |
| 3-104239 | 5/1991 | (JP) . |
| 4-27153 | 1/1992 | (JP) . |
| 7-014989 | 1/1995 | (JP) . |
| 10-056026 | 2/1998 | (JP) . |

OTHER PUBLICATIONS

Wolf, Silicon Processing for the VLSI Era, vol. 2, Process Integration, pp. 508–510, Lattice Press, 1990.*
"Elimination of Sidegating in n–Channel GaAs MESFET's Using a p–Type Well", Canfield et al, GaAs IC Symposium, 1992, pp. 237–240.
"Trap Effects in p–Channel GaAs MESFET's", Peng et al, *IEEE Transactions on Electron Devices*, vol. 39, No. 11, Nov. 1992, pp. 2444–2451.

"A p–Well GaAs MESFET Technology for Mixed–Mode Applications", Canfield et al, *IEEE Journal of Solid–State Circuits*, vol. 25, No. 6, Dec. 1990, pp. 1544–1549.

* cited by examiner

*Primary Examiner*—Matthew Smith
*Assistant Examiner*—Calvin Lee
(74) *Attorney, Agent, or Firm*—Arent Fox Kintner Plotkin & Kahn PLLC

(57) ABSTRACT

In a compound semiconductor device constituting a field effect transistor having a buried p region 3, a channel region 4 is formed thin and highly doped by n-type impurity, and the buried p region 3 is formed shallowly and highly doped by p-type impurity to compensate the highly doped channel region 4. In order to prevent a leakage current between the highly doped buried p region 3 and a gate electrode 5, a low concentration p-type impurity region 2 is formed on both sides of the highly doped buried p region 3 to thus prevent a current flow via a portion other than a channel region. Accordingly, there can be provided the compound semiconductor device including an FET which is able to suppress both the deterioration in the pinch-off characteristic and the leakage current between neighboring elements due to p-type impurity conduction other than a channel in an FET which has a high concentration and thin active layer, while suppressing the short channel effect.

17 Claims, 9 Drawing Sheets

Gate Length Lg ≦ 0.35 μm

COMPOUND SEMICONDUCTOR DEVICE AND METHOD OF MANUFACTURING THE SAME

BACKGROUND OF THE INVENTION

1. Field of the Invention

The present invention relates to a compound semiconductor device and a method of manufacturing the same and, more particularly, an FET manufacturing method utilizing a field effect transistor (referred simply to as an "FET" hereinafter) and an ion implantation process.

2. Description of the Prior Art

As typical devices as a transistor employing compound semiconductor, there are a GaAs MES FET (Metal Semiconductor FET), a HEMT (High Electron Mobility Transistor), etc. The GaAs MES FET has such features that a high frequency operation can be achieved with low noise, a high speed switching operation can be achieved, etc. Thus, the GaAs MES FET is suitable for various applications, e.g., a high frequency/high output amplifier, a high frequency/low noise amplifier, a high speed change-over switch, etc. At present, the GaAs MES FET has been broadly used as a gate array, an amplifier IC in the mobile communication, a high speed optical communication IC, etc. Also, with the progress of information communication technology in recent years, a higher operational speed of the device is now requested.

The GaAs semi-insulating substrate is employed in the GaAs MES FET, and GaAs is a compound semiconductor consisting of a group III element and a group V element. A device using such compound semiconductor is called a compound semiconductor device. Since GaIs has a high electron mobility and a high saturation drift velocity, it is fitted for a high speed/high frequency device. More particularly, the electron mobility in a pure GaAs is higher about five times than silicon (Si), and a peak velocity of the saturation drift velocity of the pure GaAs is higher about twice than the saturation velocity of Si. In addition, since the pure GaAs has the high mobility, an electric field required for the peak velocity is small rather than Si. Further, since GaAs can be formed as a crystal with higher resistance rather than Si, such GaAs is called a semi-insulating crystal. Therefore, if a single device or an integrated circuit is fabricated by using a semi-insulating substrate, a parasitic capacitance can be reduced generally and device isolation can be facilitated.

As with GaAs MES FET manufacturing method, the self-alignment FET employs the gate electrode made of WSi, or the like, whose gate characteristic is not deteriorated even when the high temperature annealing process is applied to the gate electrode, as a mask for $n^+$ ion-implantation. Such self-alignment FET has a very small source resistance Rs because an $n^+$ layer is formed in close vicinity of the gate, and the manufacturing steps are relatively simple because such self-alignment FET is formed as a simple planar structure without a recess structure, so that such self-alignment FET has been broadly used.

An operation speed of the MES FET is decided by a cut-off frequency $f_T$ which is in inverse proportion to the gate length Lg. Therefore, in order to accelerate the operation speed, it is an effective means to reduce the gate length Lg. However, in reducing the gate length Lg, sometimes a phenomenon which is called a short channel effect such as increase in a drain conductance or increase in a well up current occurs to thus deteriorate device characteristics.

Following points can be pointed out as causes of the short channel effect.

(1) The channel thickness tch must be reduced to mate with reduction of the gate length Lg and also impurity concentration of the channel region must be increased such that an aspect ratio of gate length/channel thickness (Lg/tch) is not so reduced. However, this aspect ratio is not set in the appropriate range. The gate length is a length of the gate electrode in a direction from a source region to a drain source region.

(2) The potential of a depletion layer immediately below the gate electrode extends downward with the reduction of the gate length Lg, so that thermionic emission into the semi-insulating substrate becomes prominent.

(3) The current which flows between opposed $n^+$ regions, i.e., a highly doped layer below the source electrode and a highly doped layer below the drain electrode, via the semi-insulating substrate is increased.

Among these causes of the short channel, it is evident that the cause (1), i.e., the aspect ratio (Lg/tch) is not set in the appropriate range, can be improved by executing the ion-implantation into the n-type channel region at the low energy and the high dosage.

In order to prevent the thermionic emission into the semi-insulating substrate set forth in the cause (2) and the increase in the current flowing between the opposed $n^+$ regions set forth in the cause (3), the structure which is known as the "buried p type region" is effective. In the buried p type region structure, the buried p type region is formed in the semi-insulating substrate side which contacts the channel region and the $n^+$ region to form pn junction and thus depletion layers are formed on interfaces between the channel region and the $n^+$ region and the semi-insulating substrate to prevent the leakage current.

Figure 1A:
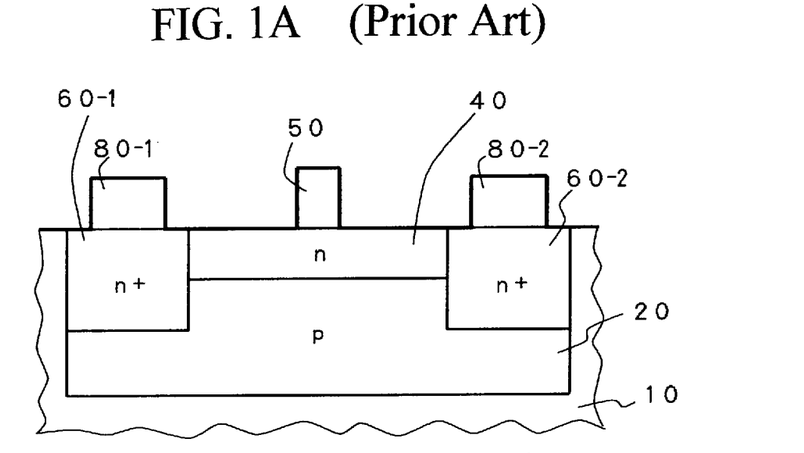
FIG. 1A is a sectional view showing the FET.
Figure 1B:
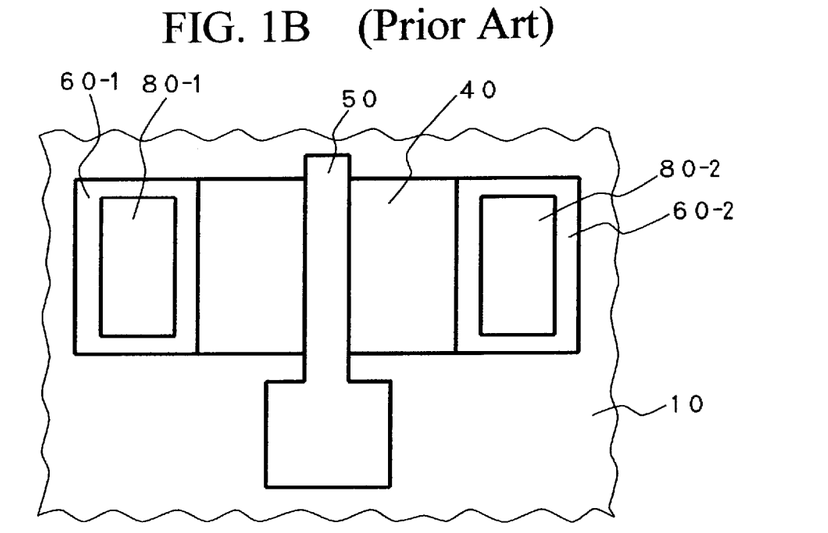
FIG. 1B is a plan view showing the FET.
Figure 1C:
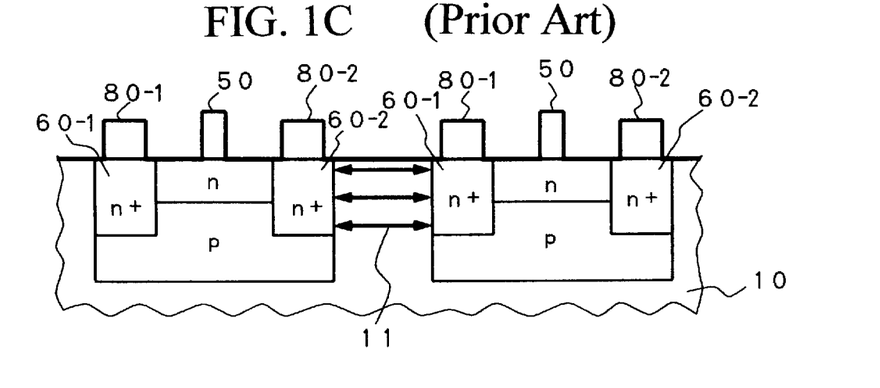
FIG. 1C is a sectional view showing leakage current paths between elements as an issue of the FET in the prior art.

FIGS. 1A to 1C are views showing the typical buried p type region structure in the FET as the compound semiconductor device in the prior art. FIG. 1A is a sectional view showing the compound semiconductor device employing the buried p type region structure, FIG. 1B is a plan view (top view) showing the buried p type region structure in FIG. 1A, and FIG. 1C is a sectional view showing an issue of the compound semiconductor device in the prior art, i.e., leakage current paths between elements. In the compound semiconductor device employing the buried p region structure shown in FIGS. 1A to 1C, a p-type impurity region 20 is formed on a surface of a semi-insulating substrate 10 by ion implantation using photoresist (not shown) as a mask, and then an n-type active region (channel region) 40 is formed by another ion implantation using the same photoresist (not shown) as a mask. Then, a gate electrode 50 is formed on the channel region 40, then openings (not shown) on the semi-insulating substrate 1 are formed in an $SiO_2$ film (not shown) and a photoresist film (not shown) on the basis of the gate electrode 50 as an alignment mark, and then a high concentration n-type impurity region (source region) 60-1 and a high concentration n-type impurity region (drain region) 60-2 are formed by ion implantation on both sides of the gate electrode 50 via the openings in a self-alignment manner. These regions are then activated by the annealing process, and then a source electrode 80-1 and a drain electrode 80-2 are formed.

Figure 2A:
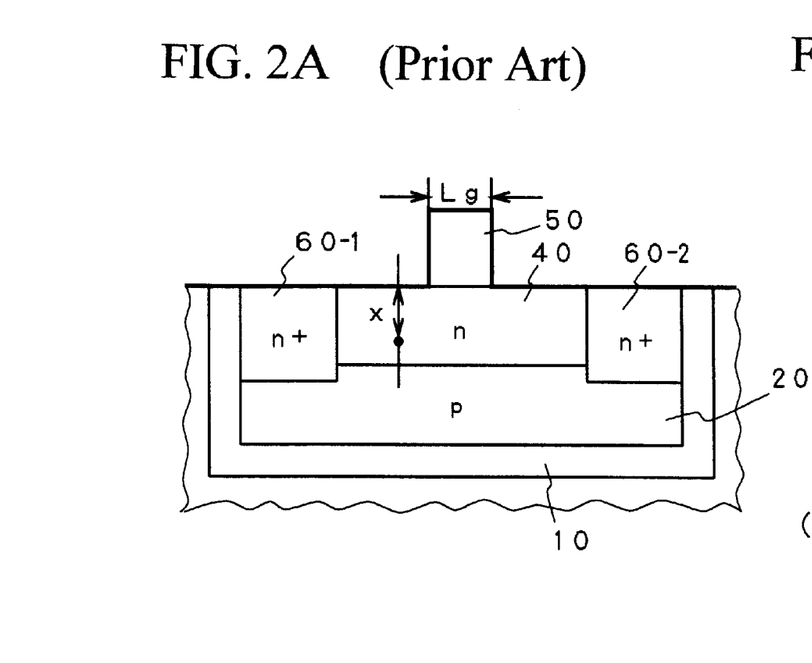
FIG. 2A is a sectional view showing conception of the buried p structure.
Figure 2B:
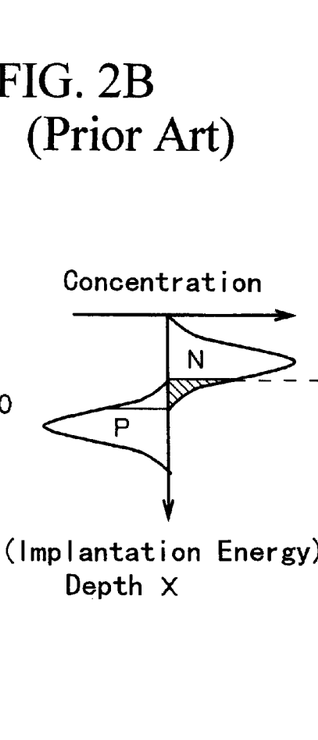
FIGS. 2B and 2C are views showing an implantation energy in the p-type buried structure in FIG. 2A respectively.
Figure 2C:
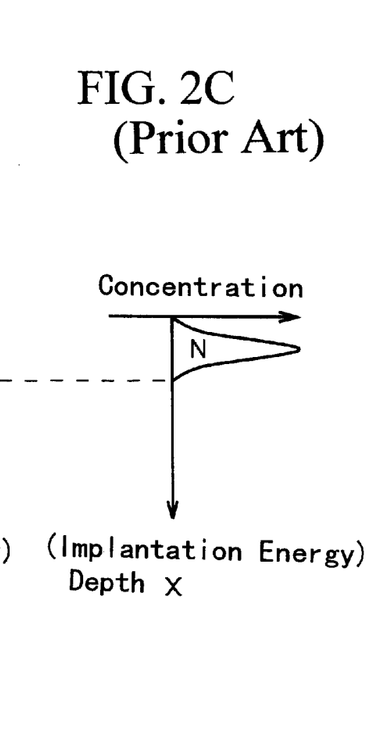

Next, conception of the buried p structure will be explained in brief with reference to FIGS. 2A to 2C hereunder. As shown in FIG. 2A, the buried p type structure has a p-type impurity region 20 which is buried below the n-type active region 40, the high concentration n-type impurity region 60-1 and the high concentration n-type impurity region 60-2. FIG. 2B is a view showing an ion implantation energy in the buried p structure at a depth x from the surface of the substrate 1 which corresponds to positions of the n-type active region 40 and the p-type impurity region 20 in FIG. 2A. In FIG. 2B, the n-type and p-type impurities are overlapped on a boundary portion between the n-type active region 40 and the p-type impurity region 20 (shaded area). Carriers are canceled in this overlapping area and thus, as shown in FIG. 2C, n-type implantation carriers remains sharply in the n-type active region 40, whereby the thin channel can be formed. The pn junction below the thin channel is formed as a depletion region.

However, it has already been found that, when the device shown in FIGS. 1A to 1C is manufactured actually by way of trial, the leakage current generated by the n-type conduction (electron conduction) 11 between fringes of the high concentration n-type impurity regions 60-1, 60-2, as shown in FIG. 1C, is increased, and thus both reduction in the pinch-off characteristic between the source-drain regions and degradation of the isolation characteristic between neighboring devices are caused.

Figure 3A:
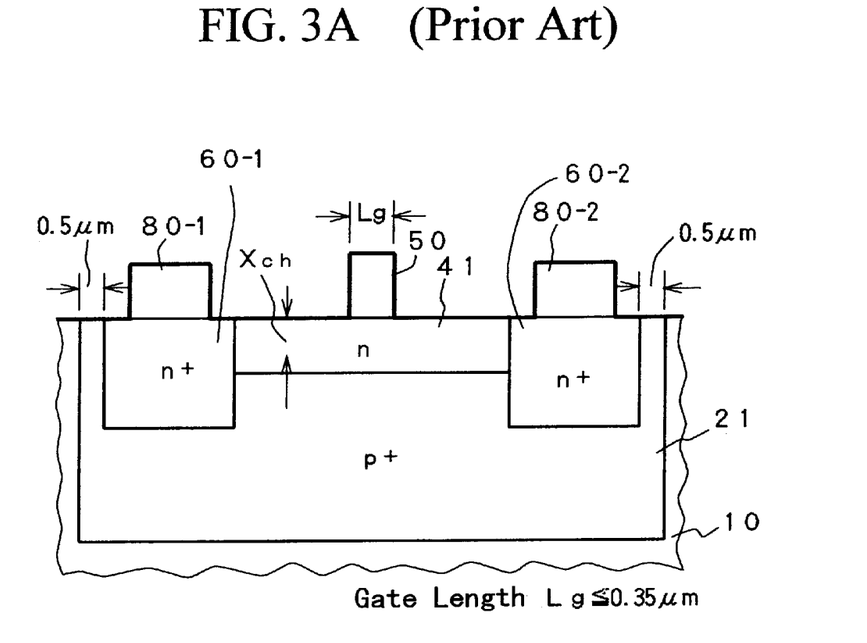
FIG. 3A is a sectional view showing the FET.
Figure 3B:
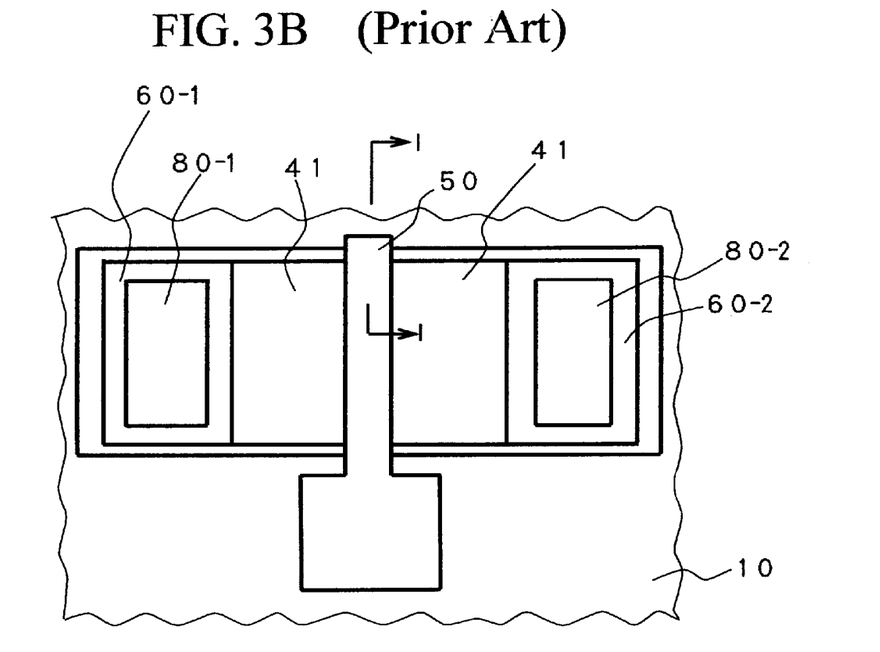
FIG. 3B is a plan view showing the FET.

In order to overcome the above problems, the proposal has been made wherein the ion implantation regions constituting the high concentration n-type impurity regions 60-1, 60-2 should not be formed identically in the width direction to be aligned with the p-type impurity region 20, but the high concentration n-type impurity regions 60-1, 60-2 should be formed to be surrounded by a p-type impurity region 21, as shown in FIGS. 3A and 3B. In other words, the p-type impurity region 21 is positioned on the outside of the high concentration n-type impurity regions 60-1, 60-2 by about 0.5 $\mu$m by expanding outward from respective side end portions of the high concentration n-type impurity regions 60-1, 60-2, so that the p-type impurity region 21 can be formed on the outside of the high concentration n-type impurity regions 60-1, 60-2.

In such buried p structure wherein the p-type impurity region 21 is extended from the n-type active region, it has been found that, in the FET having the gate length Lg of more than about 0.5 $\mu$m, the short channel effect can be sufficiently suppressed and thus good device characteristics can be achieved.

However, in the FET having the shorter gate length Lg, e.g., Lg$\leq$0.35 $\mu$m, the channel region must be formed under considerably low energy/high dosage condition. Thus, the optimum p-type impurity region 21 must also be formed inevitably under the low energy/high dosage condition to mate with such channel region.

In other words, commonly it is said that the short channel effect becomes prominent when the gate length/channel thickness (Lg/tch) value is less than about 4.0 to 5.0. In order to avoid the short channel effect, the channel thickness (depth) tch must be thinned in correspondence to reduction in the gate length Lg. However, when the channel thickness tch is thinned, dosage of a channel region 41 must be increased inevitably in order to ensure a predetermined current flowing through the channel, i.e., to keep (channel thickness tch)×(dosage)=constant.

In this manner, when the channel region 41 is highly dosed, the p-type impurity region 21 formed below the channel region 41 must also be highly dosed correspondingly. More particularly, since the channel region 41 is formed shallow (thin) and is highly dosed, the p-type impurity region 21 is also positioned at a shallow location and must be dosed highly enough to compensate the highly dosed n-type active region 41. Accordingly, the p-type impurity region 21 positioned at the periphery of the FET also becomes the highly dosed region.

Figure 4A:
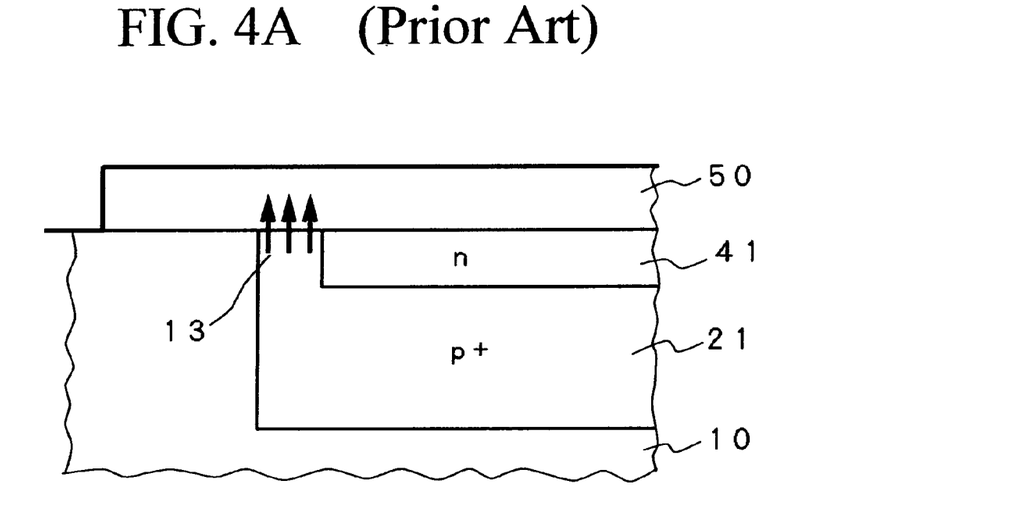
FIG. 4A is a fragmental sectional view showing a current flowing through a portion other than a channel of this FET.

As a result, as shown in FIG. 4A which is a sectional view taken along a line I—I in FIG. 3B, it has been experimentally confirmed that, in the Schottky junction between a metal and a p-type layer, i.e., between a gate electrode 50 and the high concentration p-type impurity region 21, a hole conduction current flowing from the high concentration p-type impurity region 21 to the gate electrode 50 becomes prominent at a portion other than the channel region of the FET. Therefore, the Schottky barrier junction cannot be kept and thus sometimes the pinch-off characteristic of the FET is damaged.

Figure 4B:
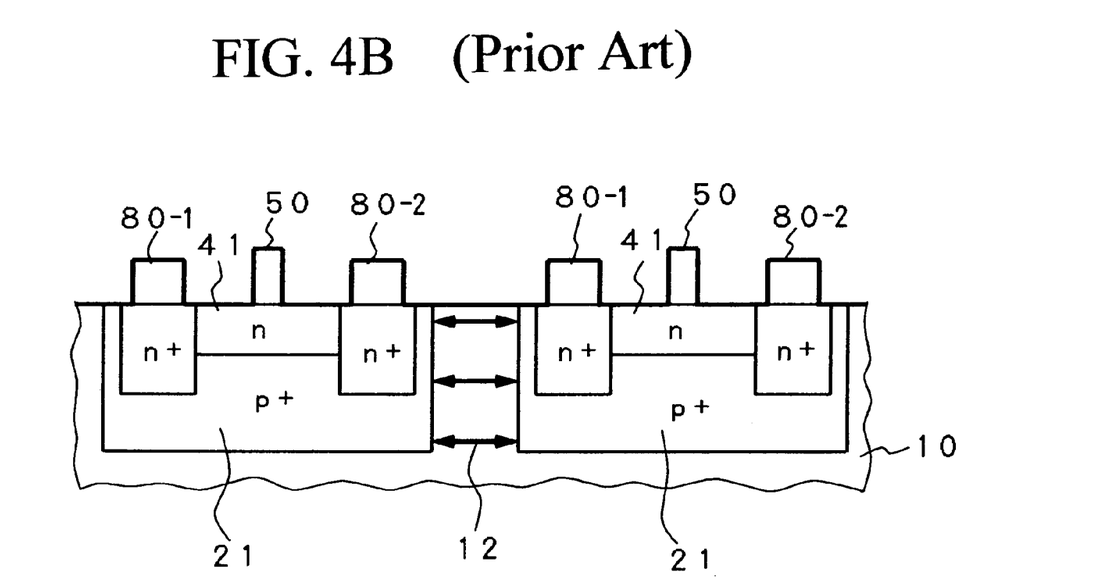
FIG. 4B is a sectional view showing leakage current paths between elements as the issue of this FET.

In addition, as shown in FIG. 4B which shows two neighboring devices, a distance between the neighboring devices is reduced since the p-type impurity region 21 is extended, and sometimes p-type conduction (hole conduction) 12 is caused between the high concentration p-type impurity regions 21 of the neighboring devices via the substrate 1 since the p-type impurity region 21 is highly doped. In order to suppress the p-type conduction 12 between the neighboring p-type impurity regions 21, it is needed to extend physically the device distance, which goes against the miniaturization of the device.

Like the above, the problem such that the pinch-off characteristic of the device is damaged or the highly doped p-type impurity regions 21 is exposed from the side surface if the channel is optimized. Conversely, the appropriate channel region cannot be kept if the device is designed to clear up such problem.

Typically such problems become issues of the FET of the short gate length. However, essentially such problems are not limited to the FET of the short gate length. More particularly, in the FET having the gate length Lg of about 1.0 $\mu$m, if the high concentration and thin active layer and the buried p structure are formed, the problems described in connection with FIGS. 4A and 4B also occur.

SUMMARY OF THE INVENTION

Accordingly, it is an object of the present invention to provide a compound semiconductor device including an FET which is capable of suppressing both deterioration in a pinch-off characteristic and leakage between neighboring elements, or either deterioration in the pinch-off characteristic or leakage between neighboring elements, due to p-type impurity conduction other than a channel in an FET which has a high concentration and thin active layer and a buried structure.

It is another object of the present invention to provide a compound semiconductor device including an FET which is capable of suppressing both deterioration in a pinch-off characteristic and leakage between neighboring elements, or either deterioration in the pinch-off characteristic or leakage between neighboring elements, due to p-type impurity conduction other than a channel, while typically suppressing a short channel effect in an FET having a short gate length.

It is still another object of the present invention to provide a method of manufacturing a compound semiconductor device including an FET which is capable of suppressing both deterioration in a pinch-off characteristic and leakage between neighboring elements, or either deterioration in the pinch-off characteristic or leakage between neighboring elements, due to p-type impurity conduction other than a channel in an FET which has a high concentration and thin active layer and a buried structure.

According to the present invention, a compound semiconductor device comprises a low concentration p-type impurity region formed on a substrate; a source region and a drain region each of which is formed of a high concentration n-type impurity region formed over the low concentration p-type impurity region; a channel region which is formed of an n-type impurity region provided between the source region and the drain region; and a high concentration p-type impurity region formed at least below the channel region.

In the compound semiconductor device according to the present invention, since the high concentration p-type impurity region is formed at a shallow position to correspond to the thin and highly doped n-type channel region, the predetermined current flowing through the channel region can be assured while avoiding the short channel effect. In addition, since the low concentration p-type impurity region is provided so as to surround the high concentration n-type source region, the high concentration n-type drain region, and the high concentration p-type impurity region, the current flow through portions other than the channel region, e.g., the leakage current between the high concentration p-type impurity regions in the neighboring devices, and the leakage current via Schottky junction between the gate electrode and the high concentration p-type impurity region can be prevented.

In other words, since the low concentration p-type impurity region is present on side surfaces and the bottom surface of the FET device by limiting the high concentration p-type impurity region only below the active region not to expose the high concentration p-type impurity region from the side surfaces and the bottom surface, the leakage current is not generated between the high concentration p-type impurity regions in the neighboring devices.

Similarly, since the low concentration p-type impurity region contacts the gate electrode but the high concentration p-type impurity region does not contact the gate electrode, the leakage current via the Schottky junction between the gate electrode and the high concentration p-type impurity region, which has been pointed out as the issue above, is not generated.

BRIEF DESCRIPTION OF THE DRAWINGS

FIGS. 1A to 1C are views showing an FET as a compound semiconductor device having a buried p structure in the prior art, wherein

FIGS. 3A and 3B are views showing an FET as a compound semiconductor device having the buried p structure which has already been proposed in order to overcome the issue of the FET in the prior art in FIG. 2A, wherein

FIGS. 4A and 4B are views showing an issue of an FET as a compound semiconductor device having the buried p structure which has already been proposed in FIGS. 3A and 3B, wherein

FIGS. 5A to 5C are views showing an FET as a compound semiconductor device having a buried p structure according to the present invention, wherein

DESCRIPTION OF THE PREFERRED EMBODIMENTS

A compound semiconductor device and a method of manufacturing the same according to embodiments of the present invention will be explained in detail with reference to the accompanying drawings hereinafter. The same reference symbols are labeled to the same elements throughout all the drawings and their redundant explanation will be omitted.

[Configuration of a compound semiconductor device]

Figure 5A:
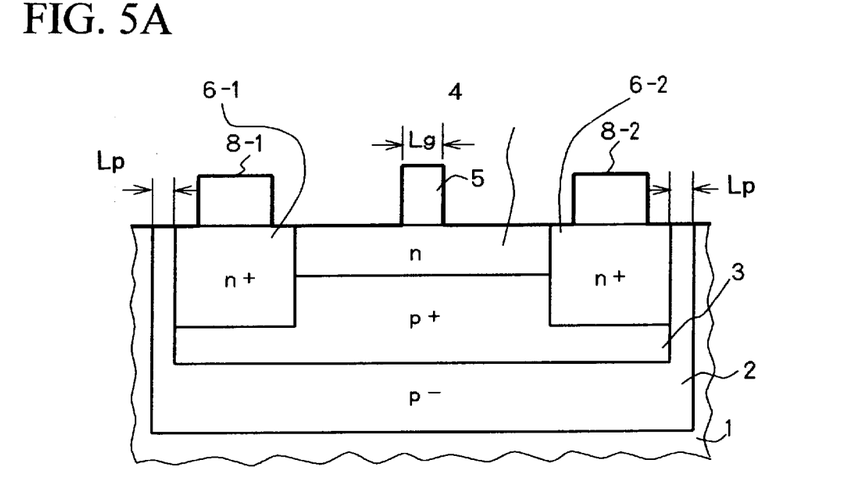
FIG. 5A is a sectional view showing the FET.
Figure 5B:
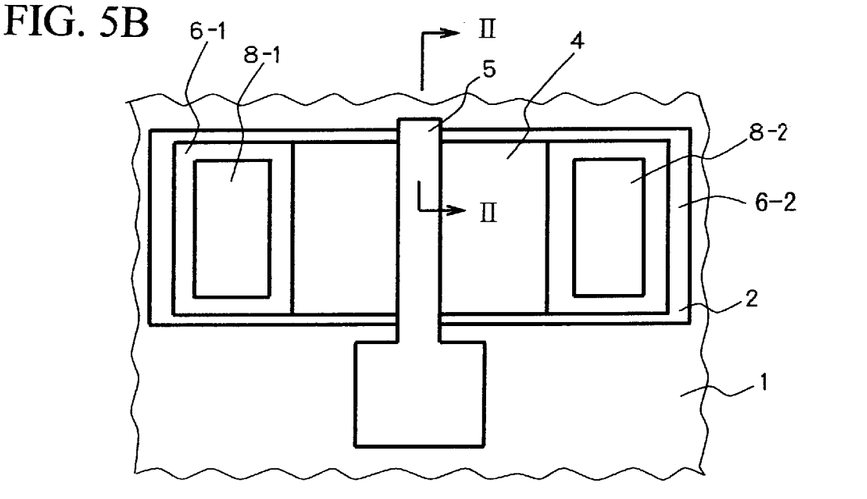
FIG. 5B is a plan view showing the FET in FIG. 5A.
Figure 5C:
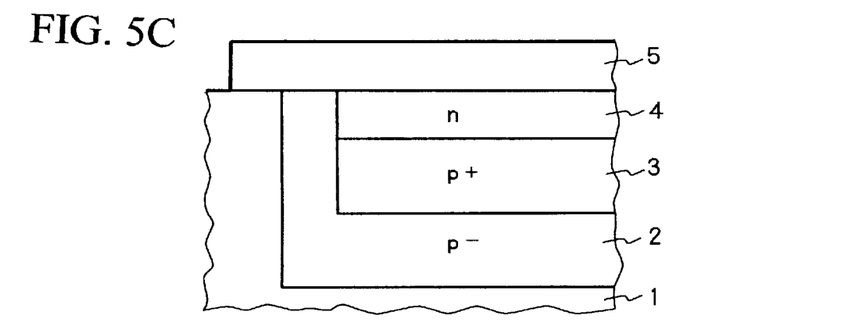
FIG. 5C is a fragmental sectional view showing a sectional shape of the FET taken along a line II—II in FIG. 5B.

FIGS. 5A to 5C are views showing an FET as a compound semiconductor device having a buried p structure according to the present invention. More particularly, FIG. 5A is a sectional view showing the FET according to the present invention, FIG. 5B is a plan view (top view) showing the FET in FIG. 5A, and FIG. 5C is a fragmental sectional view showing a sectional shape of the FET taken along a line II—II in FIG. 5B.

As shown in FIG. 5A, a low concentration p-type impurity region 2 is formed to a predetermined depth from a main surface in a GaAs (gallium arsenide) semi-insulating substrate 1 so as to surround a semiconductor device region. A high concentration p-type impurity region 3 is formed in the low concentration p-type impurity region 2 so as to contact the p-type impurity region 2. A center region of the high concentration p-type impurity region 3 is formed as a raised portion. A thin n-type active region (channel region) 4 is formed on the raised portion of the high concentration p-type impurity region 3. A source region 6-1 and a drain region 6-2 as first high concentration n-type impurity regions are formed on both sides of the n-type channel region 4 and the raised portion of the high concentration p-type impurity region 3. In this case, the source region 6-1 and the drain region 6-2 may be oppositely positioned respectively.

A gate electrode 5 having a short gate length Lg is formed on the n-type channel region 4. A source electrode 8-1 is formed on the source region 6-1, and a drain electrode 8-2 is formed on the drain region 6-2.

Above constituent elements will be explained in detail respectively hereunder.

The GaAs semi-insulating substrate 1 is suitable for a high speed/high frequency device. This is because GaAs is a compound semiconductor consisting of a group III element and a group V element, and also GaAs has a high mobility of electron and a high saturation drift velocity. In general, the GaAs semi-insulating substrate 1 has features that a parasitic capacitance can be made small and device isolation can be facilitated.

The low concentration p-type impurity region 2 is formed to extend from the source region 6-1, the n-type channel region 4, and the drain region 6-2 in both directions by about 0.5 μm on a surface of the GaAs semi-insulating substrate 1. The low concentration p-type impurity region 2 is formed by ion-implanting Mg ions at the acceleration energy of about 180 keV and an implantation dosage of about $1.0 \times 10^{12}/cm^2$.

The high concentration p-type impurity region 3 is formed by ion-implanting Mg ions at the acceleration energy of about 90 keV and an implantation dosage of about $2.0 \times 10^{12}/cm^2$.

The n-type channel region 4 is formed by implanting Si ions at the acceleration energy of about 15 keV and an implantation dosage of about $1.0 \times 10^{13}/cm^2$, by using the same opening or window (not shown) of a resist film as that employed in forming the high concentration p-type impurity region 3.

The gate electrode 5 is formed of WSi (tungsten silicide), TiWSi (titanium tungsten silicide), or the like, and contacts the n-type channel region 4 via Schottky barrier contact. The Schottky barrier contact is defined as such a contact that a current component is increased exponentially when a forward bias voltage +V is applied to the metal electrode 5 from the external device after the metal electrode contacts the n-type semiconductor whereas the current component reduce to exhibit a rectifier characteristic when a backward bias voltage −V is applied to the metal electrode.

The reason why WSi, etc. is employed as the gate electrode 5 is that a gate characteristic is not deteriorated by high temperature annealing in the postprocessing and thus a self-alignment step can be employed by using the gate electrode 5 as a mask for n⁺ ion implantation.

Because of the short gate channel FET, typically a gate length Lg of the gate electrode 5 is very short like about 0.35 μm or less. However, as described above, the gate length of the gate electrode 5 is not always limited to the short gate length Lg, a relatively long gate length such as Lg=1.0 μm or so may be employed.

The source region 6-1 and the drain region 6-2 are formed by ion-implanting Si ions at the acceleration energy of about 120 keV and an implantation dosage of about $5.0 \times 10^{13}/cm^2$.

Each of the source electrode 8-1 and the drain electrode 8-2 is composed of a three-layered structure which consists of AuGe, Ni, and Au in the order from the bottom. The source electrode 8-1 and the drain electrode 8-2 contact the source region 6-1 and the drain region 6-2 via ohmic contact which has a linear voltage-current characteristic respectively.

As evident from FIGS. 5A to 5C, according to the present embodiment, in the FET which has the high concentration and thin active layer and the buried layer, a bottom surface and side surfaces of the high concentration p-type impurity region 3 and the source and drain regions 6-1 and 6-2 constituting this FET are covered with the low concentration p-type impurity region 2. Therefore, the leakage current generated between the high concentration p-type impurity regions 3 in the neighboring devices, which has been explained with reference to FIG. 4A, is never caused.

The thickness Lp of the low concentration p-type impurity region 2 on the sides of the source and drain regions 6-1 and 6-2 and the high concentration p-type impurity region is 0.5 μm, for example.

In addition, the problem, described with reference to FIG. 4A, such that the hole conduction current becomes prominent at the portion other than the channel region in the Schottky junction between the metal and the p-type layer, i.e., between the gate electrode 5 and the high concentration p-type impurity region 21 and thus the pinch-off characteristic of the device is damaged can be overcome. In other words, the leakage current due to the hole conduction is not substantially produced in the structure in FIG. 5C because the high concentration p-type impurity region 3 does not contact the gate electrode 5 but the low concentration p-type impurity region 2 contacts the gate electrode 5.

In this way, according to the present embodiment, the FET which is able to suppress the p-type conduction in the portion other than the active region can be implemented. That is, according to the present embodiment, there can be provided the compound semiconductor device including an FET, which can suppress the deterioration in the pinch-off characteristic and the leakage current between neighboring elements due to the p-type impurity conduction in the portion other than the channel in the FET which has the high concentration and thin active layer and the buried layer.

(Modification)

In the present embodiment, in the event that the requirement for the leakage current, etc. between the devices is relatively weak and does not raise a critical issue, the FET which is able to achieve the substantially similar advantages can be implemented by the more simple step of forming the low concentration p-type impurity region 2 on the overall surface of the wafer without patterning.

[Compound semiconductor device manufacturing methods]

FIGS. 6A to 6F are views showing particular manufacturing methods of the FET shown in FIGS. 5A to 5C. A first manufacturing method of the present invention will be explained with reference to FIGS. 6A to 6F, and a second manufacturing method of the present invention will be explained with reference to FIGS. 7A to 7E.

According to both the first manufacturing method and the second manufacturing method, an enhancement type FET (abbreviated as an "E-FET" hereinafter) and a depletion type FET (abbreviated as an "D-FET" hereinafter) are manufactured simultaneously on the right half area and the left half area of the substrate 1 respectively.

The E-FET is a normally off type FET in which, in order to reduce the power consumption, the channel is pinched off not to flow the drain current when the gate applied voltage Vg=0. In the E-FET, normally the pinch off voltage is called a threshold voltage and has a positive value. On the contrary, the D-FET is brought into a state that the drain current is flown when the gate applied voltage Vg=0. The D-FET is a normally on type FET, and is called as the depletion type FET because it is operated by depleting the channel.

The reason for manufacturing the E-FET and the D-FET as a pair of FETs can be given as follows. For example, in an inverter as a basic circuit of the integrated circuit, a logic gate which is called DCFL (Direct Coupled FET Logic) consisting of a switching E-FET and a loading D-FET is employed. Therefore, in manufacturing the logic gate like DCFL, it is preferable to manufacture the E-FET and the D-FET simultaneously, as explained in the following.

In this case, in manufacturing merely one of the E-FET and the D-FET selectively, any one of the E-FET and the D-FET may be fabricated by selecting only the steps necessary for the particular device from the manufacturing steps discussed in the following.

Also, a manufacturing region for the E-FET on the substrate 1 is called an E-FET region, and a suffix "e" is attached to symbols which are labeled to respective elements in the E-FET region. Meanwhile, a manufacturing region for the D-FET on the substrate 1 is called a D-FET region, and a suffix "d" is attached to symbols which are labeled to respective elements in the D-FET region.

(First manufacturing method)

Figure 6A:
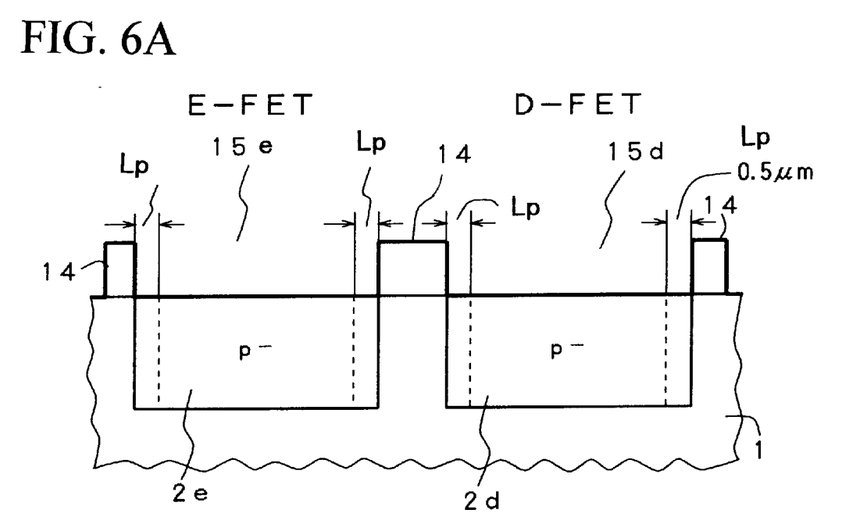
FIGS. 6A to 6F are sectional views showing particular manufacturing steps of an FET shown in FIGS. 5A to 5C according to a first manufacturing method of the present invention.

The first manufacturing method of the FET will be explained with reference to FIGS. 6A to 6F hereunder. As shown in FIG. 6A, the GaAs semi-insulating substrate 1 is prepared. A photoresist film 14 is formed on an upper surface of the substrate 1, and then openings 15e, 15d are formed in the E-FET region and the D-FET region by patterning the photoresist film 14 respectively. A size of each of the openings 15e, 15d is set such that, when the low concentration p-type impurity regions 2e, 2d are formed by succeeding steps, low concentration p-type impurity regions 2e, 2d are formed wider than both ends of the active regions 4e, 4d by about Lp, for example, 0.5 μm, respectively.

The low concentration p-type impurity regions 2e, 2d are formed in the E-FET region and the D-FET region respectively by ion-implanting Mg ions via the openings 15e, 15d at the acceleration energy of about 120 to 150 keV and the implantation dosage of about $1.0 \times 10^{12}/cm^2$. In turn, the photoresist film 14 is removed.

Figure 6B:
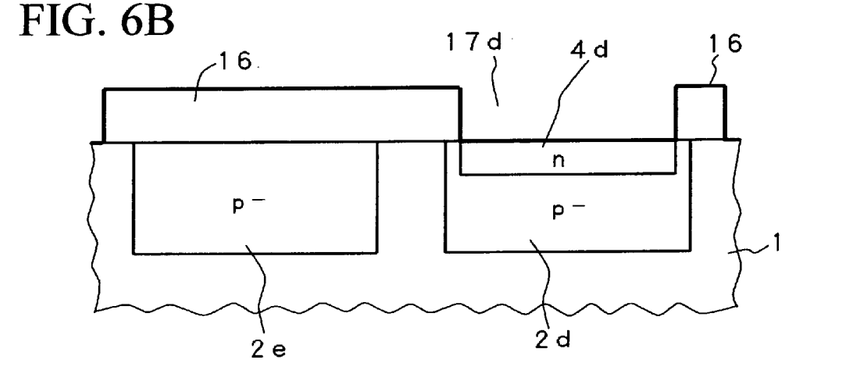

As shown in FIG. 6B, a photoresist film 16 is then formed on the upper surface of the substrate 1. An opening 17d is then formed in the D-FET region by patterning the photoresist film 16. A size of the opening 17d corresponds to an active layer 4d which is formed by succeeding steps. The active layer 4d is shallower than the low concentration p-type impurity region 2d.

Then, an n-type active layer 4d is formed in the D-FET region by ion-implanting Si ions via this opening 17d at the acceleration energy of about 40 keV and the implantation dosage of about $1.0 \times 10^{13}/cm^2$. After this, the photoresist film 16 is removed.

Figure 6C:
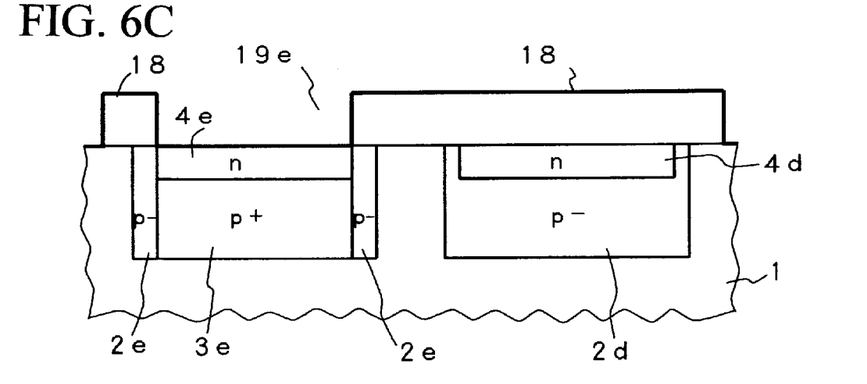

As shown in FIG. 6C, a photoresist film 18 is formed on the upper surface of the substrate 1. An opening 19e is then formed in the E-FET region by patterning the photoresist film 18. A size of the opening 19e is set to withdraw inward from both end portions of the low concentration p-type impurity region 2e by about Lp, for example 0.5 μm.

Then, a high concentration p-type impurity region 3e is formed in the E-FET region by ion-implanting Mg ions via this opening 19e at the acceleration energy of about 150 keV and the implantation dosage of about $4.0 \times 10^{12}/cm^2$. As a result, the periphery of the high concentration p-type impurity region 3e is surrounded by the low concentration p-type impurity region 2e.

In addition, with the use of the photoresist film 18, an n-type active layer 4e is formed in the E-FET region by ion-implanting Si ions via the same opening 19e at the acceleration energy of about 15 keV and the implantation dosage of about $1.0 \times 10^{13}/cm^2$. The active layer 4e is shallower than the low and high concenrtation p-type impurity region 2e and 3e. After this, the photoresist film 18 is removed.

Figure 6D:
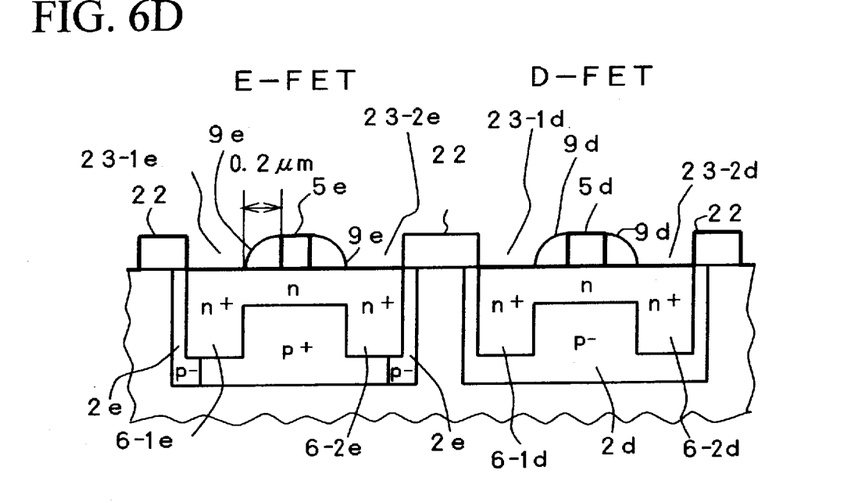

As shown in FIG. 6D, gate electrodes 5e, 5d are formed of WSi, etc. in the E-FET region and the D-FET region respectively. The gate electrode 5e formed in the E-FET region has a gate length Lg≈0.35 μm and a thickness tg≈0.5 μm. The gate electrode 5d formed in the D-FET region has a gate length Lg≈0.65 μm and a thickness tg≈0.5 μm.

Figure 7A:
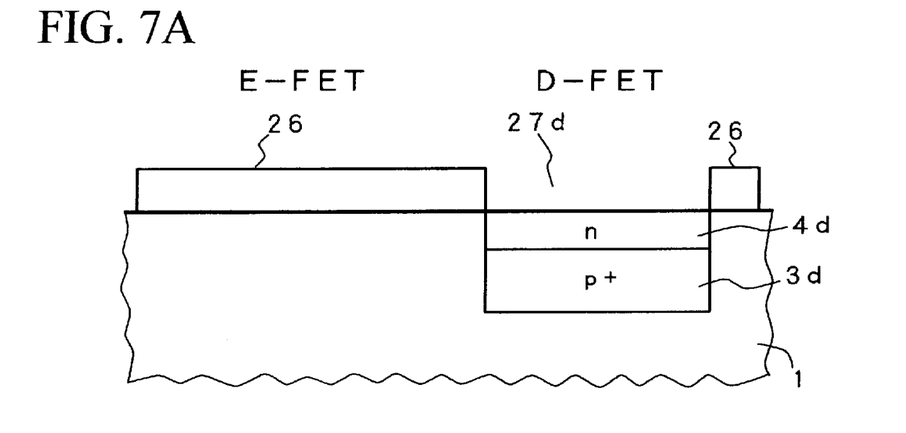
FIGS. 7A to 7E are sectional views showing particular manufacturing steps of an FET shown in FIGS. 5A to 5C according to a second manufacturing method of the present invention.

Then, the gate electrodes 5e, 5d and the upper surface of the substrate 1 are covered with an SiO$_2$ film by using the CVD method. The SiO$_2$ film is then etched by the RIE (Reactive Ion Etching) method, etc. such that, as shown in FIG. 7A, SiO$_2$ films 9e, 9d can be left along the gate electrodes 5e, 5d on both sides of the gate electrodes 5e, 5d respectively. The SiO$_2$ film 9e and 9d on the sides of the gate electrodes 5e and 5d are referred to as inslating side-wall respectively. In addition, a photoresist film 22 is formed on the upper surface of the substrate 1, and then openings are formed in the E-FET region and the D-FET region respectively by patterning the photoresist film 22. In both the E-FET region and the D-FET region, sizes of the openings in the photoresist film 22 are set to correspond to the active regions 4e, 4d.

Then, a first high concentration n-type impurity region (source region) 6-1e and a first high concentration n-type impurity region (drain region) 6-2e are formed both sides of the gate electrode 5e in the E-FET region respectively by ion-implanting Si ions via respective openings 23-1e, 23-2e, which are defined by the photoresist film 22 and the insulating side-wall 9e, at the acceleration energy of about 20 keV and the implantation dosage of about $1.0 \times 10^{13}/cm^2$. At the same time, a first high concentration n-type impurity region (source region) 6-1d and a first high concentration n-type impurity region (drain region) 6-2d are formed both sides of the gate electrode 5d in the D-FET region respectively by ion-implanting Si ions via respective openings 23-1e, 23-2e, which are defined by the photoresist film 22 and the insulating side-wall 9d, at the acceleration energy of about 20 keV and the implantation dosage of about $1.0 \times 10^3/cm^2$.

Because of the presence of the insulating side-walls 9e and 9d on the basis of the gate electrodes 5e and 5d in position, the source regions 6-1e, 6-1d and the drain regions 6-2e, 6-2d are separated from the gate electrodes 5e, 5d by 0.2 μm respectively. After this, the photoresist film 22 and the SiO$_2$ films 9e, 9d are removed respectively.

Figure 6E:
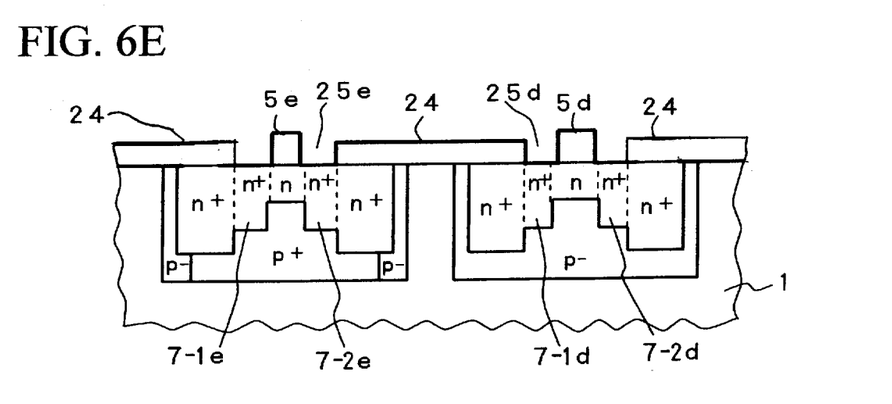

As shown in FIG. 6E, a photoresist film 24 is formed on the upper surface of the substrate 1. Openings 25e, 25d are then formed in the E-FET region and the D-FET region respectively by patterning the photoresist film 24.

Second high concentration n-type impurity regions 7-1e, 7-2e are formed both sides of the gate electrode 5e in the E-FET region respectively by ion-implanting Si ions via the opening 25e, which is defined by the photoresist film 24 and the gate electrode 5e, at the acceleration energy of about 40 keV and the implantation dosage of about $3.0 \times 10^{13}/cm^2$. At the same time, second high concentration n-type impurity regions 7-1d, 7-2d are formed both sides of the gate electrode 5e in the D-FET region respectively by ion-implanting Si ions via the opening 25d, which is defined by the photoresist film 24 and the gate electrode 5d, at the acceleration energy of about 40 keV and the implantation dosage of about $3.0 \times 10^{13}/cm^2$. After this, the photoresist film 24 is removed.

The second high concentration n-type impurity regions 7-1e, 7-2e, 7-1d and 7-2d are shallower than the first high concentration n-type impurity region 6-1e, 6-2e, 6-1d and 6-2d.

After respective impurity regions have been formed, the substrate 1 is annealed at about 800° C. for twenty minutes to activate respective impurity regions which are subjected to the ion implantation.

Figure 6F:
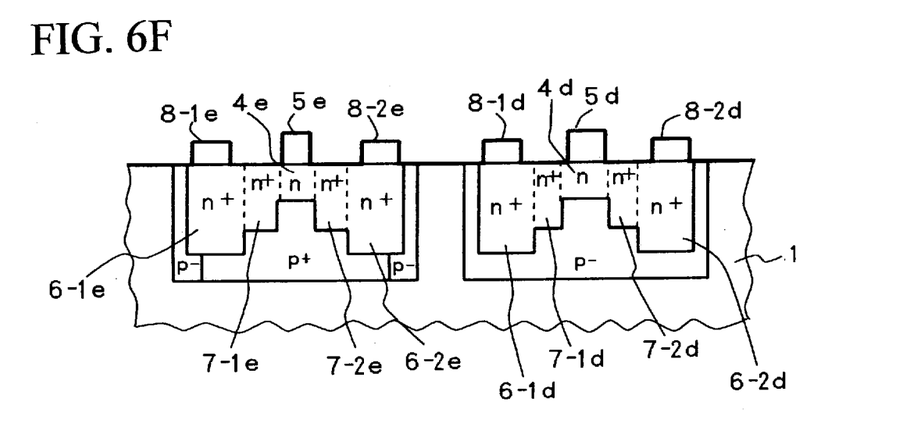

As shown in FIG. 6F, source electrodes 8-1e, 8-1d and drain electrodes 8-2e, 8-2d are formed in the E-FET region and the D-FET region respectively. Each of the source electrodes 8-1e, 8-1d and the drain electrodes 8-2e, 8-2d has a three layer structure in which AuGe/Ni/Au are stacked in sequence from the bottom. In the E-FET region, the source electrode 8-1e contacts the source region 6-1e via ohmic contact, and the drain electrode 8-2e contacts the drain region 6-2e via ohmic contact. Similarly, in the D-FET region, the source electrode 8-1d contacts the source region 6-1d via ohmic contact, and the drain electrode 8-2d contacts the drain region 6-2d via ohmic contact.

In this case, in all the second high concentration n-type impurity regions 7-1e, 7-2e in the E-FET region and the second high concentration n-type impurity regions 7-1d, 7-2d in the D-FET region, the impurity concentration is suppressed equal to or smaller than those in the first high concentration n-type impurity regions 6-1e, 6-2e in the E-FET region and the first high concentration n-type impurity regions 6-1d, 6-2d in the D-FET region. Such second high concentration n-type impurity regions 7-1e, 7-2e, 7-1d, 7-2d are provided to suppress increase in the source and drain series resistance which is generated in surface depletion layers. The surface depletion layers are formed on surfaces of the active layers 4e, 4d which are exposed from lower end portions of the gate electrodes 5e, 5d respectively.

In steps of manufacturing two FETs such as the E-FET and the D-FET which have different threshold values, while achieving the optimal p concentration in the E-FET and the D-FET respectively, the FET which is manufactured according to the first manufacturing method can suppress both the leakage current and the p (hole) conduction in the outside of the active regions by employing the steps similar to those in the case where simply the buried p layers are provided separately.

(Second manufacturing method)

Next, the second manufacturing method will be explained with reference to FIGS. 7A to 7E hereunder. As shown in FIG. 7A, the GaAs semi-insulating substrate 1 is prepared. A photoresist film 26 is formed on an upper surface of the substrate 1, and then an opening 27d is formed in the D-FET region by patterning the photoresist film 26. A size of the opening 27d is set to correspond to an active region 4d formed by succeeding steps.

A high concentration p-type impurity region 3d is formed in the D-FET region by ion-implanting Mg ions via the opening 27d at the acceleration energy of about 130 keV and the implantation dosage of about $4.0 \times 10^{12}/cm^2$. Then, an n-type active layer 4d is formed in the D-FET region by ion-implanting Si ions via the same opening 27d at the acceleration energy of about 35 keV and the implantation dosage of about $1.0 \times 10^{13}/cm^2$. In turn, the photoresist film 26 is removed.

Figure 7B:
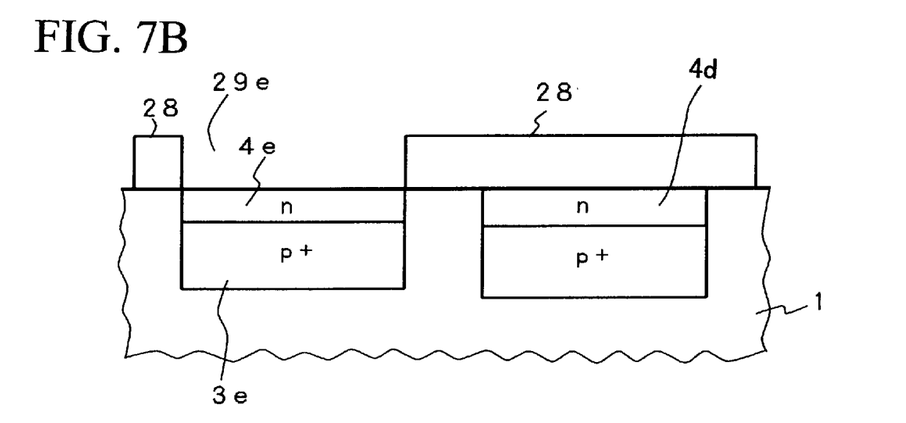

As shown in FIG. 7B, a photoresist film 28 is then formed on the upper surface of the substrate 1. An opening 29e is then formed in the E-FET region by patterning the photoresist film 28. A size of the opening 29e corresponds to an active layer 4e which is formed by the succeeding steps.

Then, a high concentration p-type impurity region 3e is formed in the E-FET region by ion-implanting Mg ions via this opening 29e at the acceleration energy of about 110 keV and the implantation dosage of about $4.0 \times 10^{12}/cm^2$. Then, an n-type active layer 4e is formed in the E-FET region by ion-implanting Si ions via the same opening 29e at the acceleration energy of about 15 keV and the implantation dosage of about $1.0 \times 10^{13}/cm^2$. After this, the photoresist film 28 is removed.

Figure 7C:
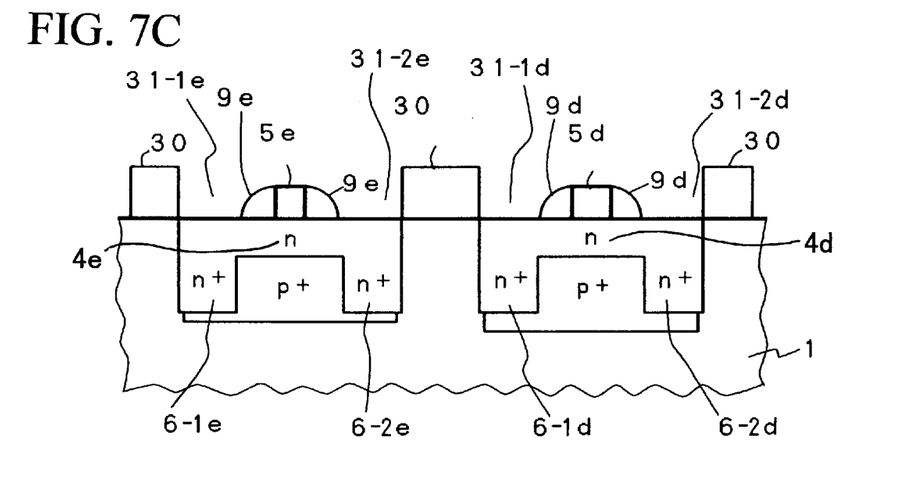

As shown in FIG. 7C, the gate electrodes 5e, 5d are formed of WSi, etc. in the E-FET region and the D-FET region respectively. The gate electrode 5e formed in the E-FET region has a gate length $Lg \approx 0.35$ μm and a thickness $tg \approx 0.5$ μm. The gate electrode 5d formed in the D-FET region has a gate length $Lg \approx 0.6$ μm and a thickness $tg \approx 0.5$ μm.

Then, the gate electrodes 5e, 5d and the upper surface of the substrate 1 are covered with an $SiO_2$ film by using the CVD method, etc. The $SiO_2$ film is then etched by the RIE (Reactive Ion Etching) method, etc. such that, as shown in FIG. 7C, the $SiO_2$ films (insulating side-walls) 9e, 9d can be left along the gate electrodes 5e, 5d on both sides of the gate electrodes 5e, 5d respectively.

In addition, a photoresist film 30 is formed on the upper surface of the substrate 1, and then openings are formed in the E-FET region and the D-FET region respectively by patterning the photoresist film 30. In both the E-FET region and the D-FET region, sizes of the openings in the photoresist film 30 are set to correspond to the active regions 4e, 4d.

Then, the first high concentration n-type impurity region (source region) 6-1e and the first high concentration n-type impurity region (drain region) 6-2e are formed in the E-FET region respectively by ion-implanting Si ions via respective openings 31-1e, 31-2e, which are defined by the photoresist film 30 and the insulating side-wall 9e, at the acceleration energy of about 100 keV and the implantation dosage of about $5.0 \times 10^{13}/cm^2$. At the same time, the first high concentration n-type impurity region (source region) 6-1d and the first high concentration n-type impurity region (drain region) 6-2d are formed in the D-FET region respectively by ion-implanting Si ions via respective openings 31-1d, 31-2d, which are defined by the photoresist film 30 and the insulating side-wall 9d, at the acceleration energy of about 100 keV and the implantation dosage of about $5.0 \times 10^{13}/cm^2$. Because of the presence of the insulating side-walls 9e and 9d, the source region 6-1d and the drain region 6-2d are separated slightly from the gate electrodes 5e, 5d by about 0.2 μm respectively. After this, the photoresist film 30 and the insulating side-walls 9e and 9d are removed respectively.

Figure 7D:
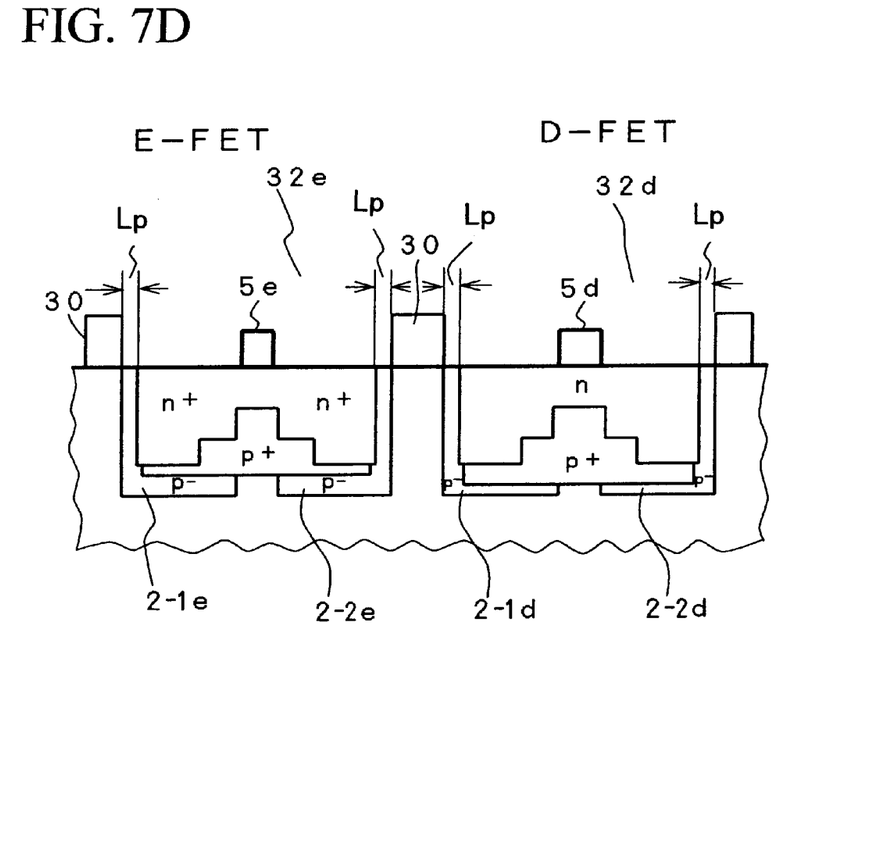

As shown in FIG. 7D, ashing process is carried out by oxidizing the photoresist film 30 in the oxygen plasma to contract the photoresist film 30. Thus, side portions of the openings formed in the photoresist film 30 are expanded outward by Lp, for example about 0.5 μm. Otherwise, a new photoresist film is formed after the photoresist film 30 is removed, and then openings which have the same size as above expanded openings are formed by patterning the new photoresist film. These openings may be employed as a second mask.

Low concentration p-type impurity regions 2-1e, 2-2e are formed in the E-FET region respectively by ion-implanting Mg ions via an expanded opening 32e at the acceleration energy of about 150 keV and the implantation dosage of about $1.0 \times 10^{12}/cm^2$. At the same time, low concentration p-type impurity regions 2-1d, 2-2d are formed in the D-FET region respectively by ion-implanting Mg ions via an expanded opening 32d at the acceleration energy of about 150 keV and the implantation dosage of about $1.0 \times 10^{12}/cm^2$.

After respective impurity regions have been formed, the substrate 1 is annealed at about 800° C. for twenty minutes to activate respective impurity regions which are subjected to the ion implantation.

Figure 7E:
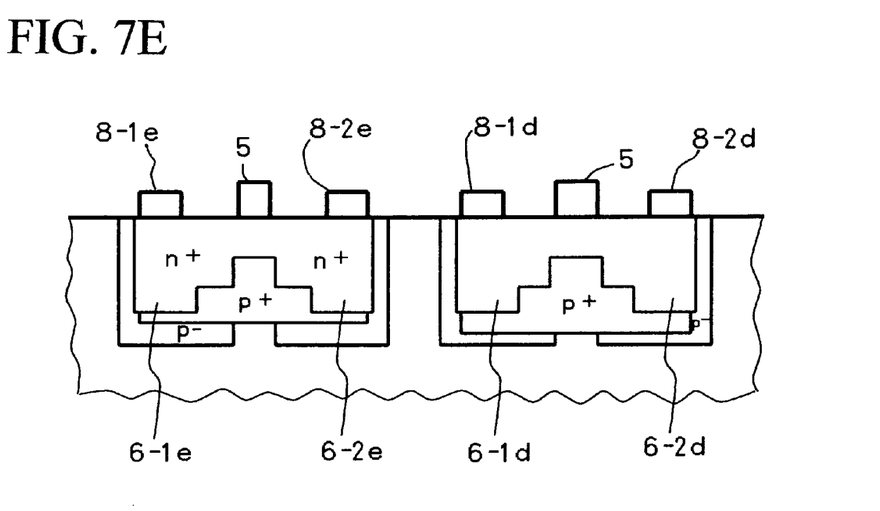

As shown in FIG. 7E, a source electrode 8-1e and a drain electrode 8-2e are formed in the E-FET region, and simultaneously a source electrode 8-1d and a drain electrode 8-2d are formed in the D-FET region. Each of the source electrodes 8-1e, 8-1d and the drain electrodes 8-2e, 8-2d has a three layer structure in which AuGe/Ni/Au are stacked in sequence from the bottom. In the E-FET region, the source electrode 8-1e contacts the source region 6-1e via ohmic contact, and the drain electrode 8-2e contacts the drain region 6-2e via ohmic contact. Similarly, in the D-FET region, the source electrode 8-1d contacts the source region 6-1d via ohmic contact, and the drain electrode 8-2d contacts the drain region 6-2d via ohmic contact.

In steps of manufacturing two FETs such as the E-FET and the D-FET which have different threshold values, while achieving the optimal buried p implantation of high concentration and low energy in the E-FET and the D-FET respectively, the FET which is manufactured according to the second manufacturing method can suppress both the leakage current and the p conduction in the outside of the active regions.

According to the present invention, there can be provided the compound semiconductor device including an FET which is capable of suppressing both deterioration in the pinch-off characteristic and leakage between neighboring elements, or either deterioration in the pinch-off characteristic or leakage current between neighboring elements, due to p-type impurity conduction other than the channel in an FET which has the high concentration and thin active layer and the buried layer.

Further, according to the present invention, there can be provided a compound semiconductor device including an FET which is capable of suppressing both deterioration in the pinch-off characteristic and leakage between neighboring elements, or either deterioration in the pinch-off characteristic or leakage current between neighboring elements, due to p-type impurity conduction other than the channel, while suppressing the short channel effect in the FET having the short gate length, for example.

What is claimed is:

1. A compound semiconductor device comprising:
    a low concentration first conductive type impurity region formed in a semiconductor substrate;
    a source region and a drain region each of which is formed of a high concentration second conductive type impurity region formed in the low concentration first conductive type impurity region away from a side face of the low concentration first conductive type impurity region;
    a channel region which is formed of an second conductive type impurity region provided between the source region and the drain region;
    a high concentration first conductive type impurity region formed at least below the channel region;
    a gate electrode formed on the channel region which is in contact with the low concentration first conductive type impurity region;
    a source electrode formed on the source region; and
    a drain electrode formed on the drain region.

2. A compound semiconductor device according to claim 1, wherein the low concentration first conductive type impurity region is a p-type impurity region, and the high concentration first conductive type impurity region is a p-type impurity region, and the high concentration second conductive type impurity region is a n-type impurity region, and the second conductive type impurity region is a n-type impurity region.

3. A compound semiconductor device according to claim 1, wherein the low concentration first conductive type impurity region is formed below the source region and the drain region and the channel region.

4. A compound semiconductor device according to claim 1, wherein the gate electrode contacts the low concentration first conductive type impurity region at an outside of the channel region.

5. A compound semiconductor device according to claim 1, wherein a boundary of a side portion of the high concentration first conductive type impurity region and the low concentration first conductive type impurity region is positioned below the source region and the drain region.

6. A compound semiconductor device according to claim 1, wherein a length of the gate electrode in a direction from the source region to drain region is 0.35 $\mu$m or less.

7. A compound semiconductor device according to claim 1, wherein the semiconductor substrate is made of GaAs.

8. A compound semiconductor device according to claim 1, wherein the shallow second conductive impurity layers are formed in regions which are positioned between the gate electrode and the source region and between the gate electrode and the drain region.

9. A compound semiconductor device comprising:
    a pair of source region and drain region, which include a first conductive type impurity respectively, formed in a semi-insulating substrate;
    an channel region, which include a first conductive type impurity, formed between the source region and the drain region;
    a high concentration second conductive type impurity region formed below the channel region; and
    a source electrode and a drain electrode connected to the source region and the drain region respectively;
    a gate electrode connected to the channel region;
    wherein a low concentration second conductive type impurity region is formed on a peripheral portion of the high concentration second conductive type impurity region and the source and drain regions, and the low concentration second conductive type impurity region is formed to surround at least side end portions of the high concentration second conductive type impurity region, and in contact with the gate electrode.

10. A compound semiconductor device according to claim 9, wherein the first conductive type impurity is a n-type impurity, and, the low concentration second conductive type impurity region is a p-type impurity region, and, the high concentration second conductive type impurity region is another p-type impurity region.

11. A compound semiconductor device according to claim 9, wherein a length of the gate electrode in a direction from the source region to drain region is 0.35 $\mu$m or less.

12. A compound semiconductor device according to claim 9, wherein the substrate is made of GaAs.

13. A compound semiconductor device according to claim 9, wherein the shallow first conductive impurity layers are formed in regions which are positioned between the gate electrode and the source region and between the gate electrode and the drain region.

14. A compound semiconductor device manufacturing method, comprising the steps of:
    forming a low concentration p-type impurity region in a semi-insulating substrate by ion-implantation;
    forming a high concentration p-type impurity region in an inside of the low concentration p-type impurity region, and away from a side face of the low concentration p-type impurity region by ion-implantation;
    forming an n-type channel region in the high concentration p-type impurity region and in the inside of the low concentration p-type impurity region by ion-implantation;
    forming a gate electrode on the n-type channel region which is in contact with the low concentration p-type impurity region;

forming a pair of source region and drain region each made of a high concentration n-type impurity region on both sides of the gate electrode by ion-implantation using the gate electrode as a mask; and forming a source electrode and a drain electrode on the source region and the drain region respectively.

15. A compound semiconductor device manufacturing method according to claim 14, wherein openings of masks which are employed at ion implantation to form at least the source region, the drain region and the high concentration p-type impurity region are positioned within an opening of a mask which is employed at ion implantation to form the low concentration p-type impurity region.

16. A compound semiconductor device manufacturing method, comprising the steps of:

forming a high concentration p-type impurity region in a semi-insulating substrate by ion-implantation;

forming an n-type channel region in the high concentration p-type impurity region by ion-implantation;

forming a gate electrode on the n-type channel region;

forming a pair of source region and drain region each made of a high concentration n-type impurity region on both sides of the gate electrode via openings which are defined by a first mask and insulating side-walls of the gate electrode;

forming a low concentration p-type impurity region by ion-implantation via a second mask which has openings larger than those in the first mask; and forming a source electrode and a drain electrode on the source region and the drain region respectively;

wherein the low concentration p-type impurity region being formed via the second mask is formed to surround roughly the source region, the drain region, and the high concentration p-type impurity region.

17. A compound semiconductor device manufacturing method, according to claim 16, wherein the second mask is formed by ashing the first mask to expand an opening of the first mask.

* * * * *